(12) United States Patent
Liang (10) Patent No.: US 10,249,534 B2
(45) Date of Patent: Apr. 2, 2019

(54) METHOD OF FORMING A CONTACT ELEMENT OF A SEMICONDUCTOR DEVICE AND CONTACT ELEMENT STRUCTURE

(71) Applicant: GLOBALFOUNDRIES Inc., Grand Cayman (KY)

(72) Inventor: Jim Shih-Chun Liang, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/608,506

(22) Filed: May 30, 2017

(65) Prior Publication Data

US 2018/0350679 A1    Dec. 6, 2018

(51) Int. Cl.
| | | |
|---|---|---|
| *H01L 21/77* | (2017.01) | |
| *H01L 21/8234* | (2006.01) | |
| *H01L 21/02* | (2006.01) | |
| *H01L 21/768* | (2006.01) | |
| *H01L 21/265* | (2006.01) | |
| *H01L 27/12* | (2006.01) | |
| *H01L 27/32* | (2006.01) | |

(52) U.S. Cl.
CPC ........ *H01L 21/77* (2013.01); *H01L 21/02019* (2013.01); *H01L 21/02118* (2013.01); *H01L 21/2652* (2013.01); *H01L 21/76816* (2013.01); *H01L 21/823425* (2013.01); *H01L 27/12* (2013.01); *H01L 27/3253* (2013.01)

(58) Field of Classification Search
None
See application file for complete search history.

(56) References Cited

U.S. PATENT DOCUMENTS

| | | | |
|---|---|---|---|
| 6,919,636 B1 * | 7/2005 | Ryan | ................ H01L 21/76807 257/751 |
| 7,115,491 B2 | 10/2006 | Huang et al. | |
| 7,309,658 B2 * | 12/2007 | Lazovsky | .............. B82Y 30/00 257/E21.251 |
| 7,655,986 B2 | 2/2010 | Rahhal-Orabi | |
| 7,902,064 B1 * | 3/2011 | Chiang | ............... C23C 16/0272 257/751 |
| 7,968,949 B2 | 6/2011 | Edelstein et al. | |
| 8,987,078 B2 | 3/2015 | Yu et al. | |
| 9,385,030 B2 | 7/2016 | Lee et al. | |

(Continued)

*Primary Examiner* — Lex H Malsawma
(74) *Attorney, Agent, or Firm* — Amerson Law Firm, PLLC (57) ABSTRACT

The present disclosure provides a contact element of a semiconductor device structure, wherein an opening is formed in an insulating material layer, the insulating material layer being provided over a semiconductor substrate. Within a lower portion of the opening, a contact liner portion is formed, the contact liner portion covering a bottom of the opening and partially covering a lower sidewall portion of the lower portion of the opening such that an upper sidewall portion at an upper portion of the opening is exposed to further processing. An insulating liner portion is formed within the opening, the insulating liner portion covering the exposed upper sidewall portion. Furthermore, a contact liner is formed within the opening, the contact liner covering the contact liner portion in the insulating liner portion, and the opening is filled with a conductive material.

19 Claims, 8 Drawing Sheets

(56) References Cited

U.S. PATENT DOCUMENTS

| | | |
|---|---|---|
| 2003/0022486 A1 | 1/2003 | Wu |
| 2004/0266170 A1 | 12/2004 | Yun |
| 2006/0128142 A1* | 6/2006 | Whelan ................ B82Y 30/00 |
| | | 438/638 |
| 2011/0101435 A1* | 5/2011 | Jung ................ H01L 27/10876 |
| | | 257/301 |

* cited by examiner

METHOD OF FORMING A CONTACT ELEMENT OF A SEMICONDUCTOR DEVICE AND CONTACT ELEMENT STRUCTURE

BACKGROUND

1. Field of the Disclosure

The present disclosure generally relates to semiconductor device fabrication at advanced technology nodes, and, more particularly, to a method of forming a contact element of a semiconductor device structure and a contact element structure of a semiconductor device.

2. Description of the Related Art

The development of advanced semiconductor device structures has led to the integration of an increasing number of semiconductor devices, such as transistors, capacitors, resistors and the like, into an integrated circuit on a semiconductor wafer. To date, the observation or projection of Moore's law is proven accurate, driving research and development in the semiconductor industry to smaller technology nodes, currently scheduled to hold at a 10 nm width in late 2017, as the result of a very aggressive scaling subjected to semiconductor devices for increasing the number or density of semiconductor devices per integrated circuit. In addition to a decreased spacing between semiconductor devices, a separation between semiconductor devices and contact elements used for contacting semiconductor devices, as well as a separation between adjacent contact elements, has been decreasing. Therefore, not only are semiconductor devices subjected to aggressive scaling, but, in addition, the contact structure of semiconductor devices, which may be considered as an interface connecting circuit elements at the device level with a metallization system, also have to be adapted to the reduced features sizes at the device level and the metallization system, leading to patterning processes of increasing complexity, e.g., lithography processes and subsequent etch processes for forming openings in interlayer dielectric layers, in order to form contact elements which contact closely spaced semiconductor devices at the device level. For example, patterning processes have to be developed that allow patterning of contact openings with a lateral width that is less than the spacing between closely spaced semiconductor devices at the device level, while, at the same time, a high degree of accuracy in appropriately aligning the corresponding etch mask may result in extremely reduced process margins.

Upon pushing forward the limits of advanced technology nodes to smaller scales in the deep submicron regime, it also becomes increasingly difficult to ensure that contacts only connect to an element to be contacted (an element which is the target of contacting), while not forming undesired contacts with other semiconductor devices or other contact elements, thereby causing contact shorts.

Figure 1:
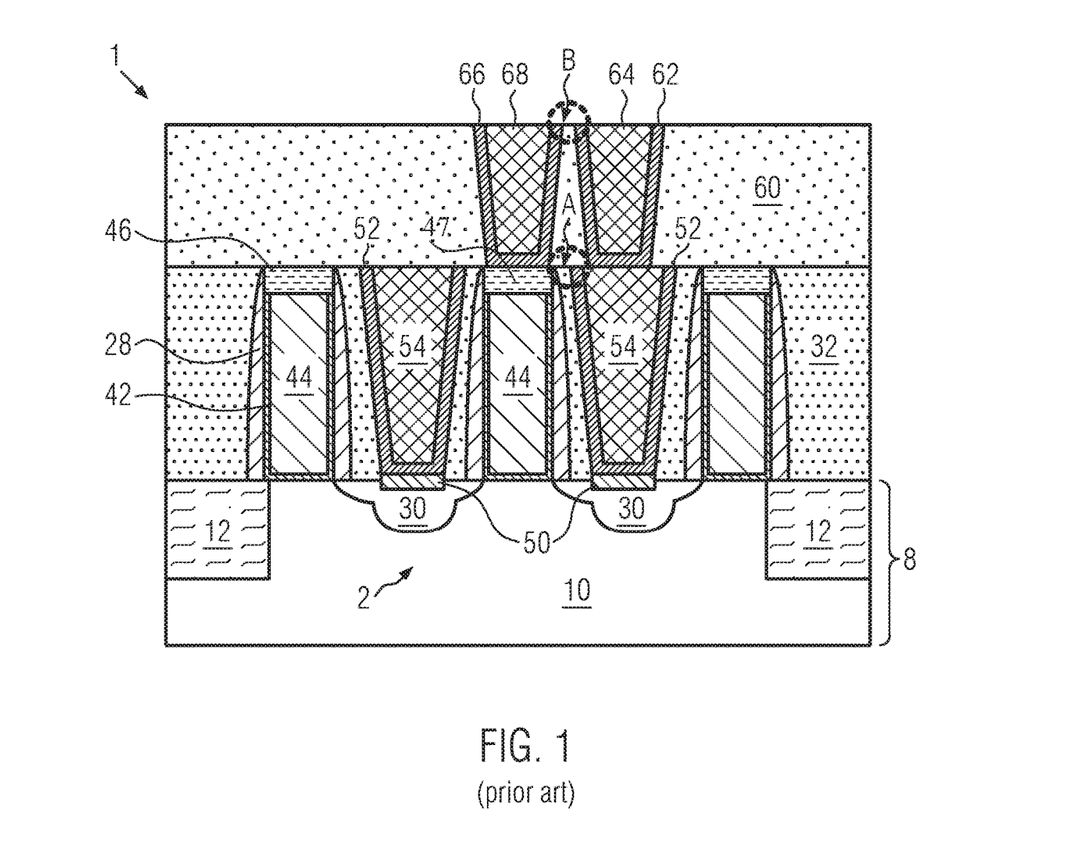
FIG. 1 schematically illustrates, in a cross-sectional view, a known semiconductor device structure.

FIG. 1 schematically illustrates, in a cross-sectional view, a semiconductor device structure 1 being formed in and above an active region 2 of a semiconductor substrate 10. The active region 2 is laterally enclosed by shallow trench isolation structures 12 that laterally delimit the active region 2 of the semiconductor substrate 10 against adjacent active regions (not illustrated). On the active region 2, gate structures are formed, each gate structure comprising a gate electrode 44, a gate dielectric 42 and sidewall spacers 28. On the two outer gate electrodes 44, a gate cap 46 is provided, while the centered gate electrode 44 has a gate silicide region 47 formed thereon. At opposing sides of the centered gate structure, source/drain regions 30 are formed within the active region 2, the source/drain regions 30 having silicide regions 50 formed in and on the source/drain regions 30. The gate structures are provided within an interlayer dielectric (ILD) 32, on top of which a dielectric material layer 60 is formed, such as a layer of silicon oxide material or a low-k material. The ILD 32 may represent a layer at the device level, while the dielectric material layer 60 may be a VIA (Vertical Interconnect Access) layer in which VIAs may be provided. VIAs represent vertical contact elements connecting contact elements in different metallization layers.

Within the ILD 32, contact elements for contacting the silicide regions 50 of the source/drain regions 30 are formed, each contact element comprising a vertically extending contact liner 52 and a contact material 54 which is laterally enclosed by the contact liner 52. Typically, the contact liner 52 is formed by TiN, while the contact material 54 is formed by one of tungsten, aluminum and copper.

In the dielectric material layer 60, contact elements for contacting devices at the device level, e.g., the gate electrode 44, or other contact elements, e.g., the contact material 54, are formed.

For example, a source/drain contact element for contacting the source/drain contact elements in the ILD 32 is provided in the dielectric material layer 60, the source/drain contact element in the dielectric material layer being formed by a contact liner 62 and a contact material 64.

Furthermore, a contact element for contacting the center gate electrode is provided by a contact liner 66 and a contact material 68 being mechanically and electrically connected to the gate silicide region 47.

As shown in FIG. 1, a separation between the contact elements in the ILD 32 and the gate electrodes 44 (a separation at reference numeral A in FIG. 1) is highly constrained by the scaling of the active region 2. Furthermore, a separation between adjacent contact elements in the dielectric material layer 60 (a separation at reference numeral B in FIG. 1) is also highly constrained by the scaling of the active region 2. Particularly, upon aggressively scaling the active region 2, the risk of forming electrical shorts between contact elements and gate electrodes and between contact elements in the metallization layer increases because the separations at regions A and B in FIG. 1 decrease. Reference numerals A and B in FIG. 1 indicate critical regions of advanced semiconductor device structures at the device level and in or between adjacent metallization layers.

In view of the above discussion, it is, therefore, desirable to provide a method of forming a contact element of a semiconductor device and to provide a contact element structure of a semiconductor device wherein electrical shorting is at least reduced, if not prevented, and wherein the risk of leakage path development is at least reduced, if not prevented.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one aspect, the present disclosure provides a method of forming a contact element of a semiconductor device structure. In accordance with some illustrative embodiments herein, the method includes forming an opening in an insulating material layer, the insulating material layer being provided over a semiconductor substrate, forming a contact liner portion within a lower portion of the opening, the contact liner portion covering a bottom of the opening and partially covering a lower sidewall portion at the lower portion of the opening such that an upper sidewall portion at an upper portion of the opening is exposed to further processing, forming an insulating liner portion within the opening, the insulating liner portion at least partially covering the exposed upper sidewall portion, forming a contact liner within the opening, the contact liner covering the contact liner portion and the insulating liner portion, and filling the opening with a conductive material, wherein the contact element is formed.

In a second aspect of the present disclosure, a contact element structure of a semiconductor device is provided. In accordance with some illustrative embodiments herein, the contact element structure includes an opening formed in an insulating material layer, the insulating material layer being provided over a semiconductor substrate, an insulating liner portion formed within the opening, the insulating liner portion covering an upper sidewall portion of the opening, a contact liner formed within the opening, the contact liner covering the insulating liner portion, a lower sidewall portion and a bottom of the opening, the upper sidewall portion and the lower sidewall portion forming a sidewall of the opening, and a conductive material formed on the contact liner, wherein the conductive material forms an integral material portion continuously extending between an upper portion of the contact element and the lower portion of the contact element.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Semiconductor devices, such as PMOS and NMOS devices, of the present disclosure may concern devices which are fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. The person skilled in the art will appreciate that, according to the present disclosure, ground rules smaller or equal to 45 nm, e.g., at 22 nm or below, may be imposed. The person skilled in the art will appreciate that the present disclosure proposes capacitor structures having minimal length dimensions and/or width dimensions smaller than 100 nm, for example, smaller than 50 nm or smaller than 35 nm or smaller than 22 nm. For example, the present disclosure may provide structures fabricated by using 45 nm technologies or below, e.g., 22 nm or even below.

The person skilled in the art will appreciate that, although a semiconductor device may be provided by a MOS device, the expression "MOS" does not imply any limitation, i.e., a MOS device is not limited to a metal-oxide-semiconductor configuration, but may also comprise a semiconductor-oxide-semiconductor configuration and the like. Furthermore, the expression "semiconductor device structure" may comprise a structure having at least one semiconductor device formed at the device level of an integrated circuit, e.g., at least one of an NMOS device and a PMOS device formed in and above a semiconductor substrate.

Regarding the wording "on," "over" and the like, no limitation is intended and, upon stating that "an element A is on an element B," the elements A and B may be in direct contact or may have at least one further element C formed in between. Accordingly, wordings such as "under," "below" and the like are not to be taken as limiting the present disclosure to the case that an element A is in direct contact with an element B formed below or under the element A, but that at least one further element C may be formed in between.

With regard to FIGS. 2a-2f, early stages of a method of forming a contact element of a semiconductor device in accordance with some illustrative embodiments of the present disclosure will be described below.

Figure 2A:
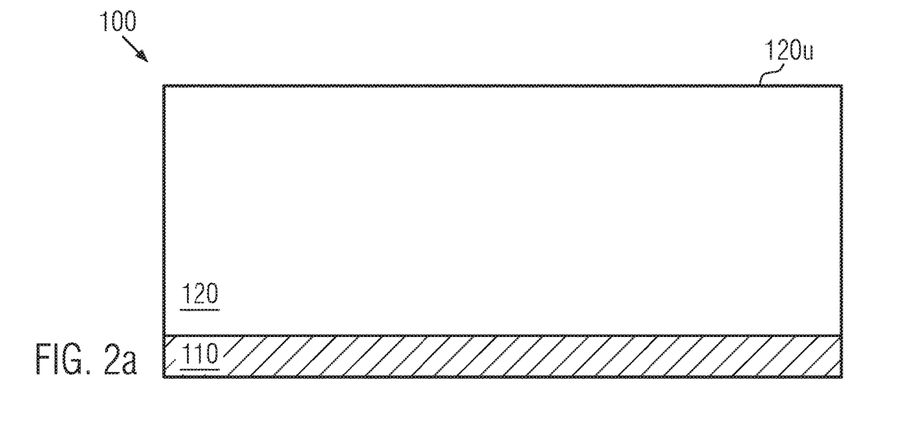
FIGS. 2a-2f show, in cross-sectional views, early stages of the formation of a contact element in accordance with some illustrative embodiments of the present disclosure.

FIG. 2a shows an enlarged section of a semiconductor device structure 100 at an early stage of a method of forming a contact element of a semiconductor device structure. Herein, an insulating material layer 120 is schematically illustrated in a cross-sectional view, the insulating material layer 120 being formed on a semiconductor substrate 110 and having an upper surface 120u which is exposed to further processing.

In accordance with some illustrative embodiments of the present disclosure, the insulating material layer 120 may comprise an oxide material and/or a low-k material (e.g., a dielectric material having k≤4).

In accordance with some illustrative embodiments of the present disclosure, the semiconductor substrate 110 may be one of a bulk substrate or a silicon-on-insulator (SOI) substrate or a general semiconductor-on-insulator substrate.

Although the insulating material layer 120 is schematically illustrated in FIG. 2a as being directly disposed on the semiconductor substrate 110, i.e., without any intermediate layer or structure formed in between, this does not pose any limitation on the present disclosure and one or more layers and/or structures may be formed between the insulating layer 120 and the semiconductor substrate 110. In accordance with some illustrative examples of the present disclosure, the insulating material layer 120 may correspond to an interlayer dielectric which may be directly formed on the semiconductor substrate 110 or a metallization layer that is separated from the semiconductor substrate 110 by at least one intermediate layer of insulating material (not illustrated).

Figure 2B:
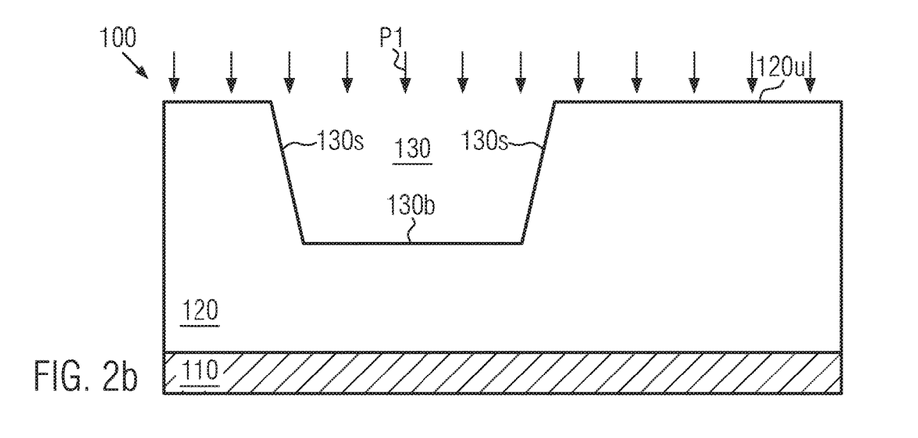

FIG. 2b schematically illustrates the semiconductor device structure 100 at a more advanced stage during fabrication, when a sequence of processes P1 is performed and an opening 130 is formed in the insulating material layer 120.

In accordance with some illustrative embodiments of the present disclosure, the sequence of processes P1 may comprise patterning the upper surface 120u of the insulating material layer, etching the patterned surface 120u (not illustrated), such that the opening 130 is formed, and removing any patterning mask provided on the surface 120u. Optionally, the sequence of processes P1 may comprise one or more cleaning steps. Upon completing the sequence of processes P1, the upper surface 120u of the insulating material layer 120 is exposed to further processing and the opening 130 is formed in the insulating material layer 120.

In accordance with some illustrative embodiments of the present disclosure, the opening 130 may partially extend into the insulating material layer 120. This poses no limitation to the present disclosure and the opening 130 may alternatively completely extend through the insulating material layer 120. As depicted in FIG. 2b, the bottom 130b of the opening 130 may expose material of the insulating material layer 120 or, alternatively, the bottom 130b of the opening 130 may expose the substrate 110, e.g., an upper surface of the substrate 110, or any material layer (not illustrated) which is disposed between the insulating material layer 120 and the semiconductor substrate 110.

As shown in FIG. 2b, a sidewall 130s of the opening 130 and the bottom 130b of the opening 130 may be exposed to further processing. The person skilled in the art will appreciate that the sidewall surface 130s of the opening 130 may represent an interface between the opening 130 and the insulating material layer 120. In other words, the sidewall surface 130s provides a surface of the insulating material 120 formed between the bottom 130b and the upper surface 120u.

Figure 2C:
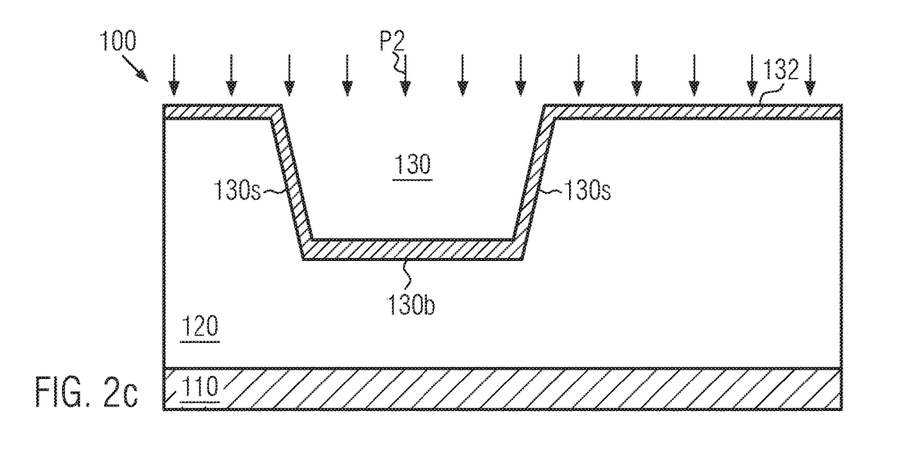

FIG. 2c schematically illustrates the semiconductor device structure 100 at a more advanced stage during fabrication when a process P2 is performed. In accordance with some illustrative embodiments of the present disclosure, the process P2 may comprise depositing a contact liner material layer 132 over the insulating material layer 120, particularly on the upper surface 120u of the insulating material layer 120, on the sidewall surface 130s of the opening 130, and on the bottom 130b of the opening 130. In accordance with some illustrative examples herein, the contact liner material 132 may comprise TiN and/or the like.

Figure 2D:
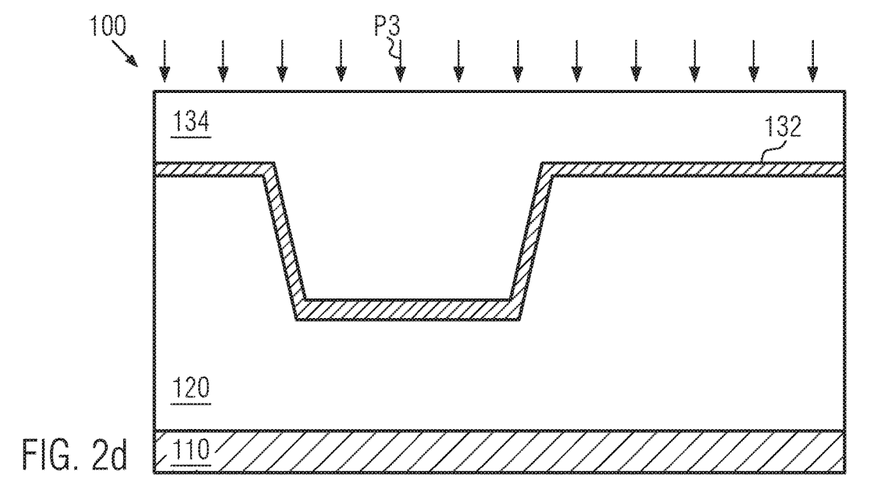

FIG. 2d schematically illustrates the semiconductor device structure 100 at a more advanced stage during fabrication, when a process P3 is performed. In accordance with some illustrative embodiments of the present disclosure, the process P3 may comprise a process employed for forming a dielectric material 134 over the deposited contact liner material layer 132.

In accordance with some illustrative examples herein, the dielectric material 134 may comprise an organic filler material or an organic planarization layer material. For example, the insulating material 134 may be formed on the deposited contact liner material layer 132 by spin-on techniques and the like. The insulating material 134 may at least partially fill the opening 130, e.g., the insulating material 134 may overfill the opening 130 as depicted in FIG. 2d.

Figure 2E:
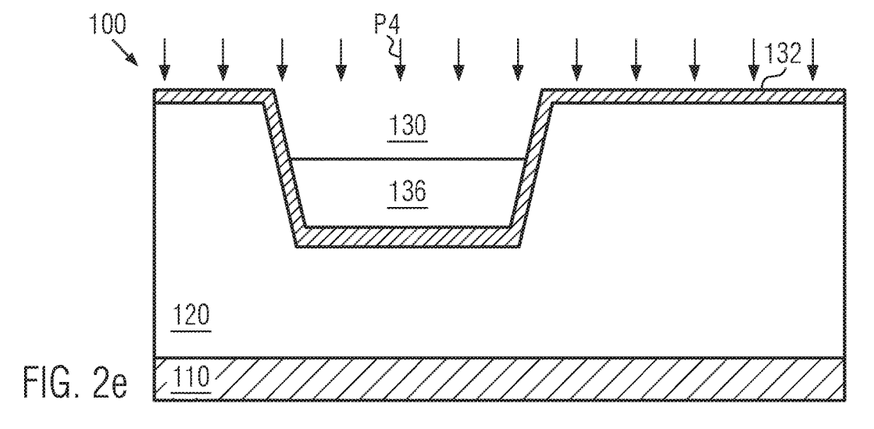

FIG. 2e schematically illustrates the semiconductor device structure 100 at a more advanced stage during processing, when a process P4 is performed. In accordance with some illustrative embodiments of the present disclosure, the process P4 may comprise recessing the dielectric material 134 of FIG. 2d such that a recessed dielectric material 136 remains, as shown in FIG. 2e.

Referring to FIG. 2e, the recessed insulating material 136 partially fills the opening 130 and partially covers a sidewall surface of the contact liner material layer 132 formed in the opening 130.

In accordance with some special illustrative examples, the process P4 may comprise a step of ashing back the insulating material 134 shown in FIG. 2d, wherein the recessed dielectric material 136 of FIG. 2e is obtained.

In accordance with some illustrative embodiments of the present disclosure, the insulating material 134 (FIG. 2d) may comprise a hydrocarbon material with no functional groups, such as polyethylene, graphic powder and the like.

Figure 2F:
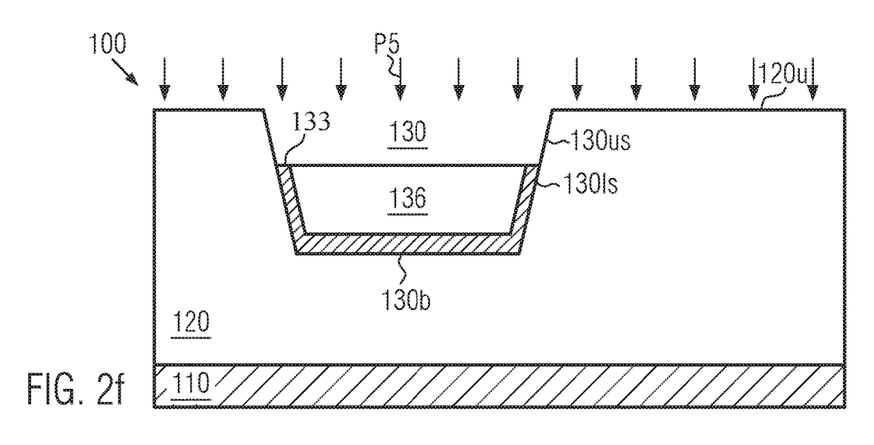

FIG. 2f schematically illustrates the semiconductor device structure 100 at a more advanced stage during fabrication, when a process P5 is performed. In accordance with some illustrative embodiments of the present disclosure, the process P5 may comprise an isotropic etch process, e.g., an isotropic wet etch process, wherein the exposed contact liner material of the contact liner material layer 132 is selectively etched relative to the recessed dielectric material 136 which partially fills the opening 130. In accordance with some special illustrative examples, the process P5 may comprise an SC1 etchant (e.g., $H_2O+H_2O_2+NH_4OH$).

Referring to FIG. 2f, upon completing the process P5, the exposed contact liner material of the contact liner material layer 132 (FIGS. 2c-2e) is removed and the upper surface 120u of the insulating material layer 120, as well as an upper sidewall portion 130us of the opening 130 is exposed to further processing, while a lower sidewall portion 130ls of the opening 130 is covered by remaining contact liner material 133 which is covered by the recessed dielectric material 136 within the opening 130.

Figure 3A:
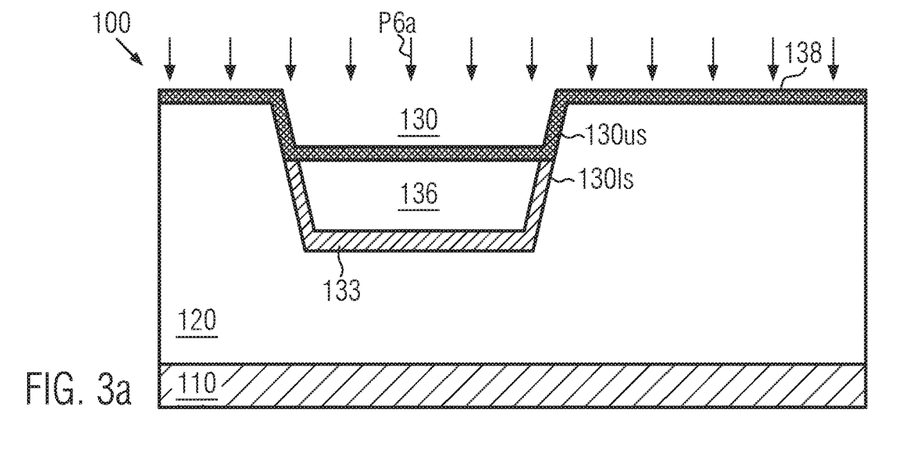
FIGS. 3a-3b show, in cross-sectional views, more advanced stages during the formation of a contact element in accordance with some illustrative embodiment of the present disclosure.

With regard to FIGS. 3a and 3b, two more advanced stages during the fabrication will be explained. FIG. 3a schematically illustrates the semiconductor device structure 100 at a more advanced stage during fabrication, when a process P6a is performed.

In accordance with some illustrative embodiments of the present disclosure, an insulating material layer 138 may be formed in process P6a, the insulating material layer 138 covering the upper surface 120u, the upper sidewall portion 130us and the recessed dielectric material 136, together with exposed surfaces of the remaining contact liner material 133 within the opening 130.

In accordance with some illustrative embodiments of the present disclosure, the process P6a may comprise a deposition process for depositing a low temperature oxide (LTO) or another suitable dielectric. For example, the process P6a may comprise an oxidation process or a chemical vapor deposition (CVD) process, depositing one of silane between 300-500° C., dichlorosilane at around 900° C., and tetraethyl orthosilicate (TEOS) between 650-750° C. In accordance with some special illustrative examples herein, dichlorsilane and TEOS may be deposited by low pressure CVD (LP-CVD), while silane may be deposited by atmospheric pressure CVD (APCVD).

In accordance with some illustrative embodiments of the present disclosure, the deposited insulating material layer 138 may have a thickness in a range from about 1-20 nm, such as from about 5-15 nm. For example, the thickness of the insulating material layer 138 may be in a range from about 5-10 nm.

Figure 3B:
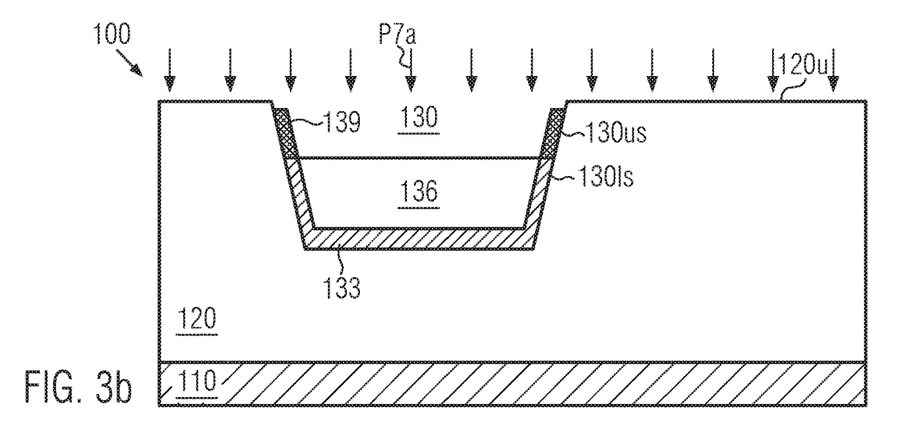

FIG. 3b schematically illustrates the semiconductor device structure 100 at a more advanced stage during fabrication, after the process P6a is completed and a subsequent process P7a is performed. In accordance with some illustrative embodiments of the present disclosure, the process P7a may be employed for removing the insulating material 138 from above the upper surface 120u of the insulating material layer 120 and from above the recessed dielectric material 136 within the opening 130. Accordingly, an insulating liner portion 139 may be provided within the opening 130, the insulating liner portion 139 representing the remains of the insulating material layer 138 when the process P7a is completed. The insulating liner portion 139 may at least partially cover the upper sidewall portion 130us within the opening 130.

In accordance with some illustrative examples herein, the process P7a may comprise a highly directional reactive ion etch (RIE) process. Alternatively, the process P7a may comprise an etch process using gas clustering ion beams (GCIB).

With regard to FIG. 4, some alternative embodiments of the present disclosure will be described. For example, an alternative process sequence may be provided, the alternative process sequence replacing the process discussed above with regard to FIGS. 3a and 3b. Accordingly, the advanced stage illustrated in FIG. 4 may be subsequent to the processing as performed up to FIG. 2f.

Figure 4:
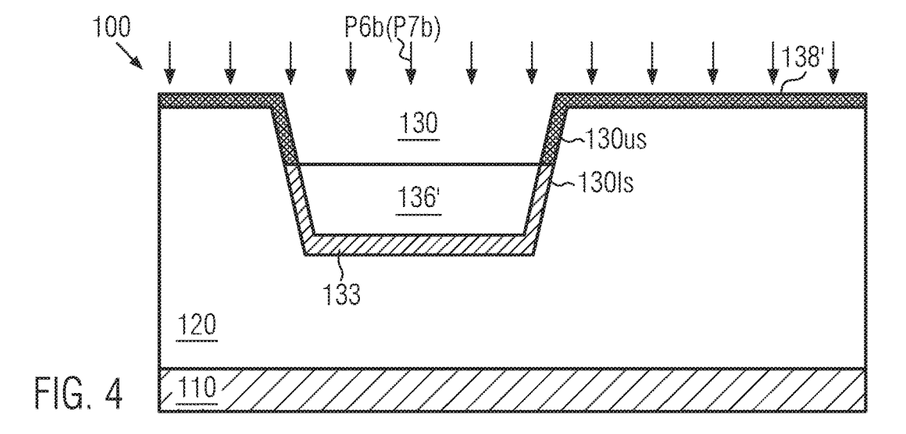
FIGS. 4 and 5 show, in cross sectional views, alternative stages during the formation of a contact element in accordance with some illustrative embodiments of the present disclosure.

FIG. 4 schematically illustrates the semiconductor device structure 100 at a more advanced stage subsequent to the processing described above with regard to FIG. 2f, wherein a process P6b is performed subsequent to the process P5 of FIG. 2f.

In accordance with some illustrative embodiments of the present disclosure, the process P6b may comprise an atomic layer deposition (ALD) of an insulating material 138', e.g., an oxide material. In accordance with some special illustrative examples herein, an organic filler 136' may be provided as the recessed dielectric material 136 of FIG. 2f and the process P6b may be configured such that the insulating material 138' may be selectively formed on exposed upper surfaces of the insulating material layer 120, e.g., on the upper sidewall portion 130us of the opening 130. The person skilled in the art will appreciate that any precursor (not illustrated) used in the ALD (of process P6b) may fail to attach to a hydrophobic carbon surface provided by the recessed organic filler 136'. Accordingly, a subsequently performed process (which is indicated in FIG. 4 by P7b) may comprise an anisotropic etch process, however, the anisotropic etch process not being required to remove the insulating material 138' over the organic filler 136'.

With regard to FIG. 5, still other alternative embodiments of the present disclosure will be described. In accordance with some illustrative embodiments herein, the processing depicted in FIG. 5 may comprise a process sequence P6c which is subsequently performed to the process P5 depicted in FIG. 2f. In accordance with some illustrative examples herein, where the recessed dielectric material 136 is an organic filler, the process sequence P6c may comprise performing an ashing process so as to remove the recessed dielectric material 136 for exposing the contact liner portion 133 within the opening 130. Subsequently, another process of the process sequence P6c may be performed for forming a self-assembled monolayer (SAM) 137 on the contact liner portion 133. Furthermore, the process sequence may comprise, after the SAM 137 is formed, performing an atomic layer deposition (ALD) for selectively depositing an insulating material layer 138" (e.g., an oxide layer) on the upper sidewall portion 130us within the opening 130 and on the upper surface 120u of the insulating material layer 120, anisotropically etching (optional) the deposited insulating material layer 138", and performing a removal process, e.g., an ashing process, in which the SAM 137 is removed and the contact liner portion 133 is exposed, as depicted in FIG. 6. After a complete reading of the present disclosure, the person skilled in the art will appreciate that anisotropically etching the deposited insulating material layer 120 may be optional since the insulating layer 138" may be selectively deposited relative to the SAM 137.

In accordance with some illustrative embodiments of the present disclosure, the SAM 137 may comprise one of Octadecanethiol, $CH_3(CH_2)_{16}CH_2SH$, 1-Dodecanethiol, and $CH_3(CH_2)_{10}CH_2SH$.

Figure 5:
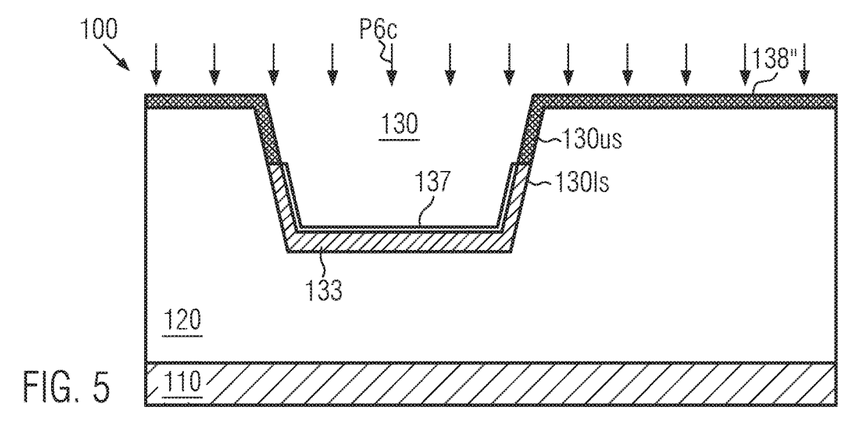
Figure 6:
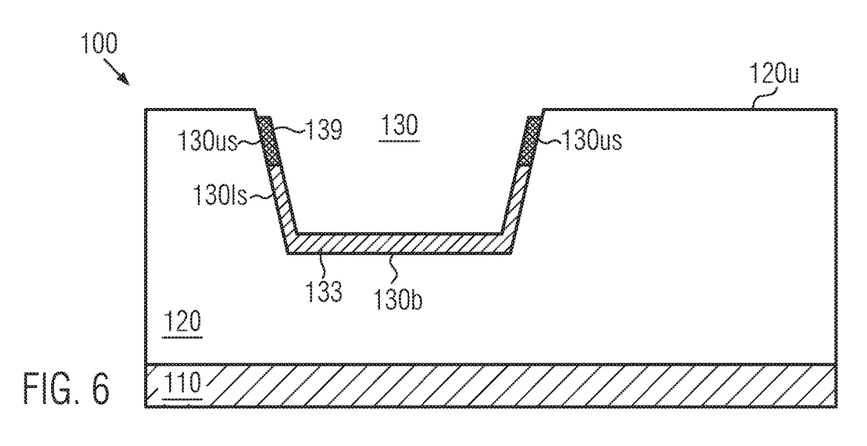
FIG. 6 shows, in a cross-sectional view, a more advanced stage during the formation of a contact element in accordance with illustrative embodiments of the present disclosure.

Referring to FIG. 6, the semiconductor device structure 100 is depicted at a more advanced stage during fabrication, when the processes P6a and P7a of FIGS. 3a and 3b are completed or the processes P6b and P7b of FIG. 4 are completed or the process sequence P6c of FIG. 5 is completed. In any case, as shown in FIG. 6, an insulating liner portion 139 may be formed within the opening 130, the insulating liner portion 139 at least partially covering the upper sidewall portion 130us within the opening 130. After a complete reading of the present disclosure, the person skilled in the art will appreciate that the contact liner portion 133 may cover the lower sidewall portion 130ls and the bottom 130b of the opening 130.

Figure 7A:
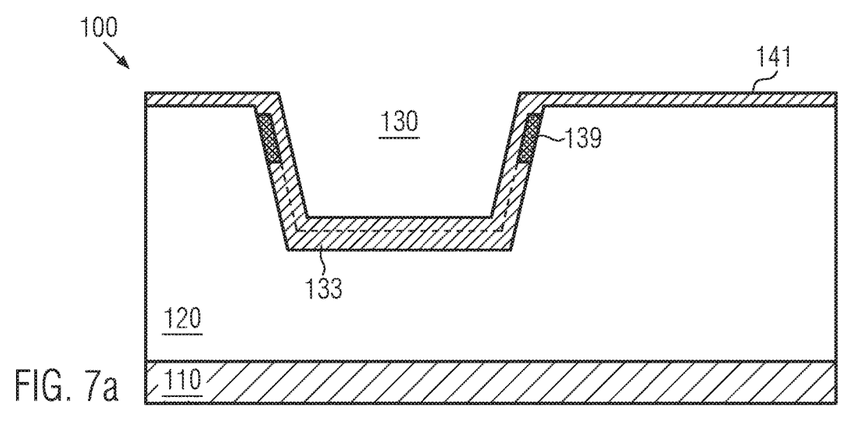
FIGS. 7a-7c show, in cross-sectional views, more advanced stages during the formation of a contact element in accordance with some illustrative embodiments of the present disclosure.

FIG. 7a schematically illustrates the semiconductor device structure of FIG. 6 at a more advanced stage during fabrication, when a contact liner material 141 is formed within the opening 130, the contact liner material 141 covering the contact liner portion 133 and the insulating liner portion 139 within the opening 130. In accordance with some illustrative embodiments of the present disclosure, the contact liner material 141 may correspond to the material of the contact liner portion 133. This poses no limitations in the present disclosure and the person skilled in the art will appreciate that different materials may be employed when forming the contact liner portion 133 and the contact liner material 141.

Figure 7B:
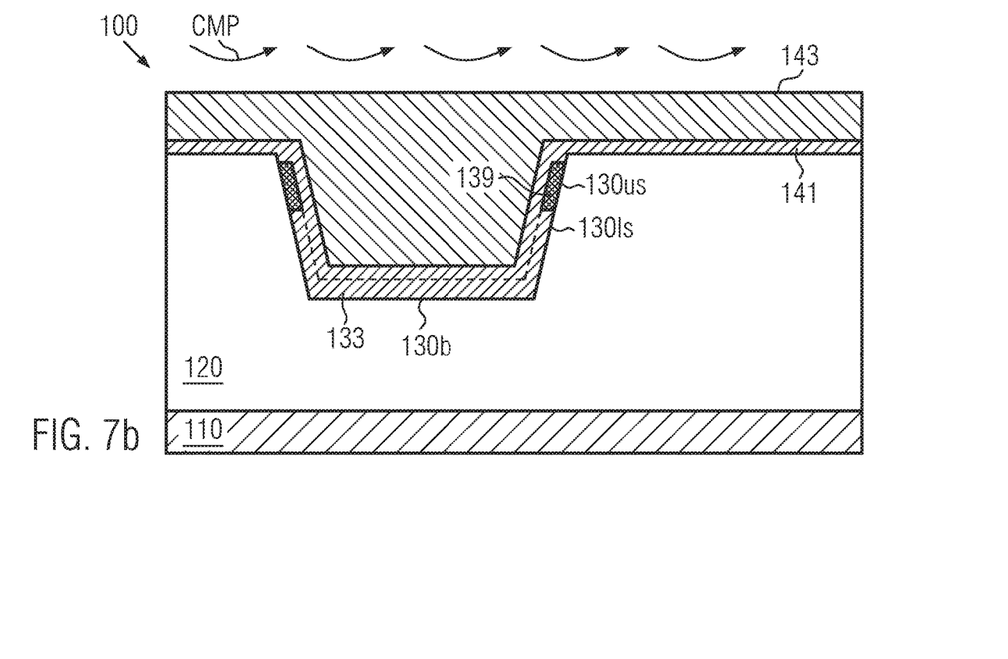

FIG. 7b schematically illustrates the semiconductor device structure 100 at a more advanced stage during fabrication, when a conductive material 143 is deposited over the insulating material layer 120 and within the opening 130, the conductive material 143 filling the opening and overfilling the opening 130. When performing a chemical mechanical polishing CMP, the conductive material 143 overfilling the opening 130 and the contact liner material 141 covering the upper surface 120u of the insulating material 120 outside the opening 130 may be removed and the upper surface 120u of the insulating material layer 120 outside the opening 130 may be exposed. Accordingly, a conductive material 145 may provide a contact element which is formed within the opening 130 on a contact liner 146, as shown in FIG. 7c.

Figure 7C:
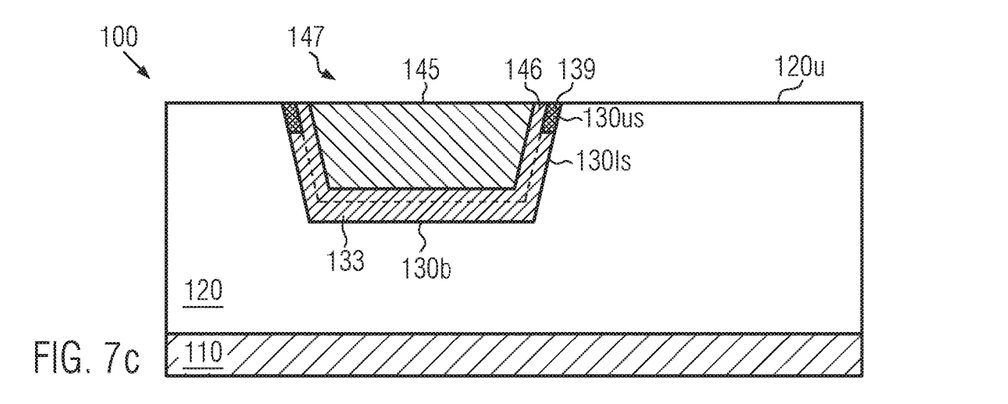

After a complete reading of the present disclosure, the person skilled in the art will appreciate that the contact liner 146 may result from the contact liner material 141 being removed from above the upper surface 120u of the insulating material 120, as depicted in FIG. 7c, showing a contact element structure 147 being formed after the CMP is completed.

In accordance with some illustrative embodiments of the present disclosure, the contact element structure 147 of FIG. 7c may comprise an opening (corresponding to the opening 130 in the preceding figures) formed in the insulating layer material 120 and being filled with the contact material 145.

In accordance with some illustrative embodiments of the present disclosure, the contact element structure 147 may further comprise the insulating liner portion 139 formed within the opening 130 and covering the upper sidewall portion 130us of the opening 130. The contact element structure 147 may further comprise a contact liner provided by the contact liner 146 and the contact liner portion 133 within the opening, the contact liner 146, 133 covering the insulating liner portion 139, the lower sidewall portion 130ls and the bottom 130b of the opening 130.

Furthermore, the contact element structure 147 may comprise a conductive material 145 formed on the contact liner (146 plus 133) within the opening 130, wherein the conductive material 145 forms an integral material portion extending continuously between an upper portion of the contact element structure 147, i.e., a portion at a height level of the insulating liner portion 139, and a lower portion of the contact element structure 147, i.e., a portion of the conductive material 145 extending between the contact liner on the bottom 130b and a height level corresponding to an interface between the insulating liner portion 139 and the contact liner portion 133.

In accordance with some illustrative embodiments of the present disclosure, the conductive material 145 may comprise tungsten or the like.

With regard to FIGS. 8a and 8b, an illustrative implementation of the above-described process sequences will be described.

Figure 8A:
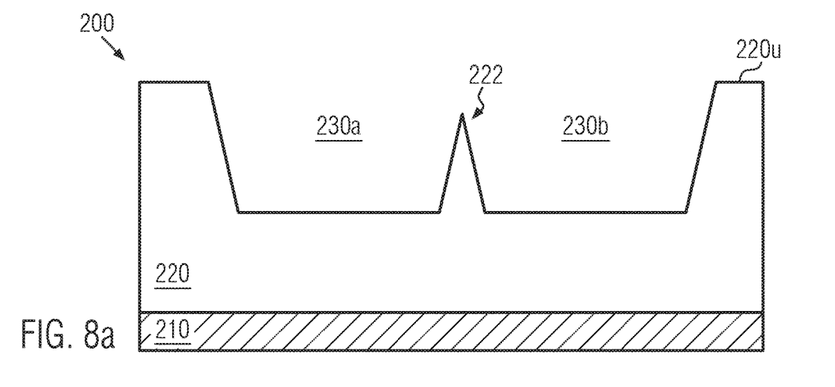
FIGS. 8a-8b show, in cross-sectional views, the formation of two adjacent contact elements in accordance with some illustrative embodiments of the present disclosure.

FIG. 8a schematically illustrates a semiconductor device structure 200 at an early stage during processing, wherein a bi-layer structure being formed by a first layer 210 and a second layer 220 is schematically illustrated in a cross-sectional view. The first layer 210 and the second layer 220 may represent a bi-layer structure of two layers being in direct mechanical contact, i.e., the second layer 220 being directly disposed on the first layer 210. This poses no limitation to the present disclosure and the first layer 210 and the second layer 220 may not be in direct mechanical contact, i.e., at least one intermediate layer (not illustrated) may be formed between the first layer 210 and the second layer 220. In accordance with some illustrative examples of the present disclosure, the first layer 210 may comprise a semiconductor substrate, and the second layer 220 may represent an insulating material layer provided on or above the semiconductor substrate.

As depicted in FIG. 8a, two trenches 230a and 230b may be formed within the second layer 220 such that the trenches 230a and 230b form openings in an upper surface 220u of the second layer 220. In accordance with some illustrative embodiments, the two trenches 230a and 230b may at least partially extend into the second layer 220.

Referring to FIG. 8a, the two trenches 230a and 230b may be separated by a tip portion 222 of the second layer 220. For example, the trenches 230a and 230b may correspond to two adjacently formed trenches in accordance with opening 130 in FIG. 2b and a height of the tip portion 222 may be equal to or less than a depth of at least one of the trenches 230a and 230b.

Figure 8B:
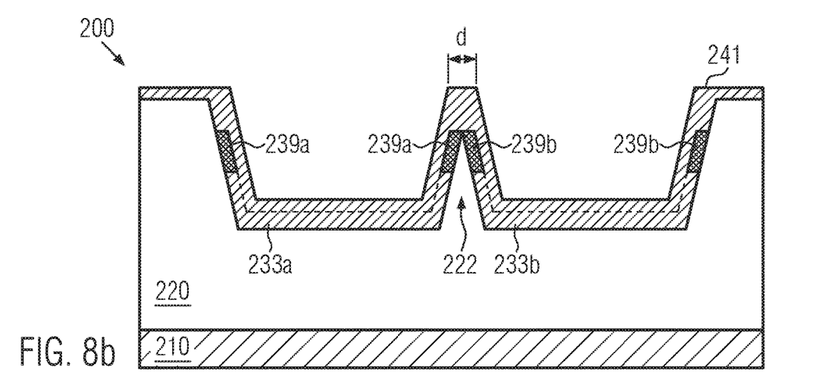

When applying the processes as described above with regard to FIG. 2c to FIG. 7c above, at a stage corresponding to the stage as depicted in FIG. 7a, the semiconductor device structure 200 as depicted in FIG. 8b may be obtained. Accordingly, a contact liner material 241 may be deposited over the second layer 220 and the trenches 230a and 230b, as well as the tip 222. The contact liner material 241 may cover an insulating liner portion 239a and a contact liner portion 233a within the trench 230a, and may cover an insulating liner portion 239b and a contact liner portion 233b within the trench 230b. Due to the insulating liner portion 239a on the tip 222, a lateral dimension of an upper portion of the tip 222 may be increased, particularly to a value d that is greater than an initial lateral width of an upper portion of the tip 222.

After a complete reading of the present disclosure, the person skilled in the art will appreciate that a tip between two adjacent trenches 230a and 230b may be "repaired" and the risk of a tip-to-tip short caused by a short between the contact material of two adjacently formed contacts may be avoided.

With regard to FIGS. 9a and 9b, further illustrative implementations of the present disclosure will be described.

Figure 9A:
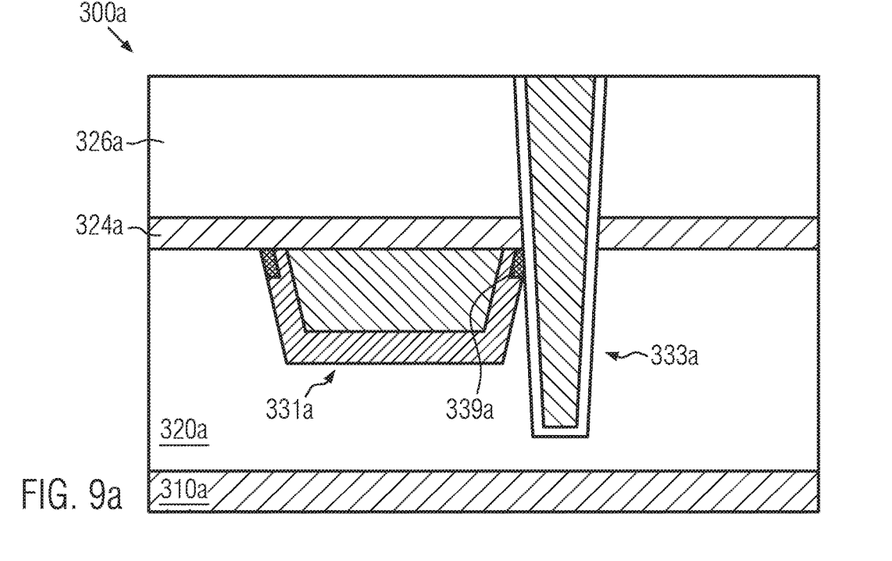
FIGS. 9a-9b show, in cross-sectional views, contact elements in accordance with some illustrative embodiments of the present disclosure.

FIG. 9a schematically illustrates a contact element structure 300a comprising a horizontally extending contact element 331a which is formed within an insulating layer 320a over a semiconductor substrate 310a and adjacent to a vertically extending contact element 333a which at least partially extends through the layer 320a. As depicted in FIG. 9a, the contact element 331a may extend within the layer 320a and may represent a horizontally extending line of conductive material. For example, the contact element 331a may be extending within a metallization layer and the vertically extending contact element 333a may be a VIA connecting to different metallization planes in the vertical direction, e.g., connecting the insulating layer 320a to a metallization plane 326a disposed on the insulating layer 320a and being separated therefrom by means of an intermediate insulating material layer 324a. In accordance with the above-described techniques, an insulating liner portion 339a may be provided at an upper sidewall portion of the contact 331a for reducing the risk of causing shorts between the contact elements 331a and 333a.

Figure 9B:
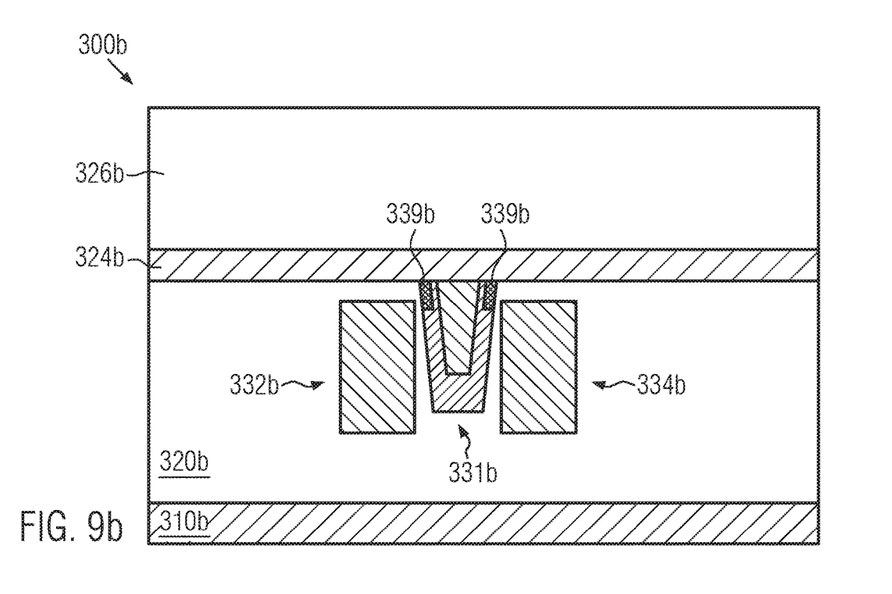

FIG. 9b schematically illustrates a contact element structure 300b comprising a contact element 331b being disposed between two adjacent formed gate structures 332b, 334b. For example, the contact element 331b may be provided within an insulating layer 320b for contacting one of source (not illustrated) and drain (not illustrated) formed in a semiconductor substrate 310b. The insulating layer 320b may be an ILD at device level and a first metallization layer 326b may be formed on the insulating layer 320b, optionally separated from the insulating layer 320b by at least one insulating layer 324b formed in between.

In accordance with some illustrative embodiments of the present disclosure, the insulating layer 324b may be formed of an oxide material and/or a low-k material. For example, the insulating layer 324b may be formed from one of an oxide material and a nitride material.

In accordance with the above-described techniques, an insulating liner portion 339b may be provided at an upper sidewall portion of the contact element 331b towards the gate structures 332b, 334b for reducing the risk of causing shorts between the contact element 331b and the gate structures 332b, 334b.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a contact element of a semiconductor device structure, the method comprising:
   forming an opening in an insulating material layer, said insulating material layer being provided over a semiconductor substrate, wherein said insulating material layer is exposed at a bottom of said opening and at sidewalls of said opening;
   forming a contact liner portion within a lower portion of said opening, said contact liner portion covering said insulating material layer at said bottom of said opening and partially covering said insulating material layer at a lower sidewall portion of said sidewalls at said lower portion of said opening such that an upper sidewall portion at an upper portion of said opening is exposed to further processing;
   forming an insulating liner portion within said opening, said insulating liner portion covering said exposed upper sidewall portion;
   forming a contact liner within said opening, said contact liner covering said contact liner portion and said insulating liner portion; and
   filling said opening with a conductive material, wherein said contact element is formed.

2. The method of claim 1, wherein forming said contact liner portion within said lower portion of said opening comprises:
   depositing a contact liner material over said insulating material layer and within said opening;
   partially filling said opening with a dielectric material, wherein said contact liner material on said upper sidewall portion is exposed to further processing; and
   isotropically etching said exposed contact liner material, wherein said upper sidewall portion is exposed.

3. The method of claim 2, wherein said exposed contact liner material covering said upper surface portion is etched by performing an isotropic wet etch process, wherein said exposed contact liner material is selectively etched relative to said dielectric material.

4. The method of claim 2, wherein said dielectric material is an organic filler which is spun-on and partially removed by an ashing process, wherein said organic filler is ashed back, said opening being partially filled with said organic filler.

5. The method of claim 4, wherein said organic filler comprises a hydrocarbon with no functional groups.

6. The method of claim 4, wherein said forming of said insulating liner portion further comprises:
   performing an ashing process, wherein said organic filler is removed in said ashing process and said contact liner portion is exposed;
   forming a self-assembled monolayer (SAM) on said contact liner portion;
   performing an atomic layer deposition (ALD) process for depositing an oxide layer on said upper sidewall portion;
   anisotropically etching said deposited oxide layer, wherein said insulating liner portion is formed; and performing an ashing process, wherein said SAM is removed in said ashing process and said contact liner portion is exposed.

7. The method of claim 6, wherein said SAM comprises one of Octadecanethiol, $CH_3(CH_2)_{16}CH_2SH$, 1-Dodecanethiol, and $CH_3(CH_2)_{10}CH_2SH$.

8. The method of claim 4, wherein said insulating liner portion is formed by depositing an oxide material by atomic layer deposition (ALD) and said ashing process is performed after said oxide material is deposited, wherein said organic filler is removed in said ashing process and said contact liner portion is exposed.

9. The method of claim 1, wherein said forming of said insulating liner portion comprises:
 depositing an insulating liner material over said insulating material layer and within said opening by an oxidization process at low temperatures; and
 anisotropically etching said insulating liner material, wherein said insulating liner portion is formed.

10. The method of claim 9, wherein said anisotropic etching comprises performing one of a highly directional reactive ion etch (RIE) and an etch process using gas clustering ion beams (GCIB).

11. The method of claim 1, wherein said forming of said insulating liner portion comprises:
 forming a self-assembled monolayer (SAM) on said contact liner portion;
 performing an atomic layer deposition (ALD) process for depositing an oxide layer on said upper sidewall portion;
 anisotropically etching said deposited oxide layer, wherein said insulating liner portion is formed; and
 performing an ashing process, wherein said SAM is removed in said ashing process and said contact liner portion is exposed.

12. The method of claim 11, wherein said SAM comprises one of Octadecanethiol, $CH_3(CH_2)_{16}CH_2SH$, 1-Dodecanethiol, and $CH_3(CH_2)_{10}CH_2SH$.

13. The method of claim 1, wherein said filling of said opening with said conductive material comprises:
 depositing a conductive material over said insulating material layer and within said opening; and
 performing a chemical mechanical polishing (CMP) process, wherein said conductive material is removed from outside said opening.

14. The method of claim 13, wherein said conductive material is tungsten.

15. The method of claim 13, wherein said contact element is in direct mechanical contact with one of a silicide region and another contact element, wherein said silicide region is formed in direct mechanical contact with one of said substrate and an electrode of a semiconductor device formed in and above said substrate, and wherein said contact element and said another contact element are selected from a VIA and a conductive line extending in a metallization layer.

16. A method of forming a contact element of a semiconductor device structure, the method comprising:
 forming an opening in an insulating material layer, said insulating material layer being provided over a semiconductor substrate;
 forming a contact liner portion within a lower portion of said opening, said contact liner portion covering a bottom of said opening and partially covering a lower sidewall portion at said lower portion of said opening such that an upper sidewall portion at an upper portion of said opening is exposed to further processing;
 forming an insulating liner portion within said opening, said insulating liner portion covering said exposed upper sidewall portion, wherein forming said insulating liner portion comprises:
  depositing an insulating liner material over said insulating material layer and within said opening by an oxidization process at low temperatures; and
  anisotropically etching said insulating liner material to remove a portion of said insulating liner material, a remaining portion of said insulating liner material forming said insulating liner portion;
 forming a contact liner within said opening, said contact liner covering said contact liner portion and said insulating liner portion; and
 filling said opening with a conductive material, wherein said contact element is formed.

17. The method of claim 16, wherein said anisotropic etching comprises performing one of a highly directional reactive ion etch (RIE) and an etch process using gas clustering ion beams (GCIB).

18. A method of forming a contact element of a semiconductor device structure, the method comprising:
 forming an opening in an insulating material layer, said insulating material layer being provided over a semiconductor substrate;
 forming a contact liner portion within a lower portion of said opening, said contact liner portion covering a bottom of said opening and partially covering a lower sidewall portion at said lower portion of said opening such that an upper sidewall portion at an upper portion of said opening is exposed to further processing;
 forming an insulating liner portion within said opening, said insulating liner portion covering said exposed upper sidewall portion;
 forming a contact liner within said opening, said contact liner covering said contact liner portion and said insulating liner portion; and
 forming a contact element within said opening that is in direct mechanical contact with one of a silicide region and another contact element, said silicide region being formed in direct mechanical contact with one of said semiconductor substrate and an electrode of a semiconductor device formed in and above said semiconductor substrate, and said contact element and said another contact element being selected from one of a VIA and a conductive line extending in a metallization layer, wherein forming said contact element comprises:
  depositing a conductive material over said insulating material layer and within said opening, said conductive material filling said opening; and
  performing a chemical mechanical polishing (CMP) process to remove said conductive material from outside said opening.

19. The method of claim 18, wherein said conductive material is tungsten.

* * * * *